United States Patent [19]

Ellis

[11] Patent Number: 5,622,795
[45] Date of Patent: Apr. 22, 1997

[54] LAT IMAGING ONTO INTERMEDIATE RECEPTOR ELEMENTS/LAT DECALCOMANIA

[75] Inventor: Ernest W. Ellis, Leverett, Mass.

[73] Assignee: Rexham Graphics Inc., So. Hadley, Mass.

[21] Appl. No.: 470,470

[22] Filed: Jun. 6, 1995

Related U.S. Application Data

[62] Division of Ser. No. 105,938, Aug. 13, 1993, abandoned.

[51] Int. Cl.$^6$ .............................. G03C 11/12; G03F 7/34
[52] U.S. Cl. ............................ 430/14; 430/201; 430/257; 430/258
[58] Field of Search .............................. 430/14, 201, 253, 430/257, 258

[56] References Cited

U.S. PATENT DOCUMENTS

| | | | |
|---|---|---|---|
| 4,421,816 | 12/1983 | Arnold | 428/202 |
| 4,766,053 | 8/1988 | Shinozaki et al. | 430/257 |
| 5,055,329 | 10/1991 | Namiki et al. | 430/257 |
| 5,156,938 | 10/1992 | Foley et al. | 430/199 |
| 5,171,650 | 12/1992 | Ellis et al. | 430/201 |
| 5,232,817 | 8/1993 | Kawakami et al. | 430/201 |
| 5,275,912 | 1/1994 | Riley | 430/201 |
| 5,278,023 | 1/1994 | Bills et al. | 430/201 |

FOREIGN PATENT DOCUMENTS

| | | |
|---|---|---|
| 0253338 | 1/1988 | European Pat. Off. . |
| 0266430 | 5/1988 | European Pat. Off. . |
| 0483802 | 5/1992 | European Pat. Off. . |
| 2255528 | 11/1992 | United Kingdom . |

*Primary Examiner*—Richard L. Schilling
*Attorney, Agent, or Firm*—Burns, Doane, Swecker & Mathis, L.L.P.

[57] ABSTRACT

Unique laser ablation transfer ("LAT") imaging technique presenting options of flexibility and versatility hitherto alien to LAT imaging science ("LATIS"), comprises LAT imaging onto special or conventional intermediate receptor elements, characteristically onto adhesive face surface thereof, and then laminating, notably hot laminating under pressure, the intermediate receptor thus imaged onto any one of a very wide variety of ultimate receptor substrates; thus produced are, e.g., original full-color prints or proofs, photomasks, monochrome or multichrome transparencies, and the like, having smooth or matte protective durable overcoatings.

10 Claims, 3 Drawing Sheets

LAT IMAGING ONTO INTERMEDIATE RECEPTOR ELEMENTS/LAT DECALCOMANIA

This application is a divisional of application Ser. No. 08/105,938, filed Aug. 13, 1993 now abandoned.

BACKGROUND OF THE INVENTION

1. Field of the Invention

The present invention relates to unique variant of laser ablation transfer ("LAT") imaging onto special intermediate receptor elements that are well suited for secondary or downstream blanketwise lamination of both the image and, advantageously, a protective overcoating therefor, to a wide variety of ultimate substrates.

Representative applications of such "LAT decalcomania" techniques according to this invention include the production of matte or glossy full-color prints or proofs, and desirable monochrome photomasking films.

2. Description of the Prior Art/Current State-of-the-Art

U.S. Pat. No. 5,156,938 to Diane M. Foley et al, assigned to the assignee hereof and hereby expressly incorporated by reference and relied upon, recounts the laser ablation transfer imaging science ("LATIS") prior art and describes a unique method/system for simultaneously creating and transferring a contrasting pattern of intelligence on and from an ablation-transfer imaging medium to a receptor element in contiguous registration therewith that is not dependent upon contrast imaging materials that must absorb the imaging radiation, typically laser radiation, and is well adopted for such applications as, e.g., color proofing and printing, computer-to-plate, the security coding of various documents and the production of machine-readable or medical items, as well as for the production of masks for the graphic arts and printed circuit industries; the ablation-transfer imaging medium, per se, comprises a support substrate and an imaging radiation-, preferably a laser radiation-ablative topcoat essentially coextensive therewith, such ablative topcoat having a non-imaging ablation sensitizer and an imaging amount of a non-ablation sensitizing contrast imaging material ("CIM") contained therein.

U.S. Pat. No. 5,171,650 to Ellis et al, also assigned to the assignee hereof and hereby also expressly incorporated by reference and relied upon, describes improved ablation-transfer imaging media having greater sensitivity, requiring less sensitizer and threshold energy (thus permitting a greater range of mass to be transferred), and which additionally are kinetically more rapid and facilitate the ablative transfer to a receptor element of an imaging radiation-ablative topcoat containing virtually any type of contrast imaging material (whether sensitizing or non-sensitizing).

Such method/system of the '650 Ellis et al patent for simultaneously creating and transferring a contrasting pattern of intelligence on and from a composite ablation-transfer imaging medium to a receptor element in contiguous registration therewith is improvedly radiation sensitive and versatile, is kinetically rapid and not dependent on a sensitized ablative topcoat, and is also very well adopted for such applications as, e.g., color proofing and printing, computer-to-plate, the security coding of various documents and the production of machine-readable or medical items, as well as for the production of masks for the graphic arts and printed circuit industries; the Ellis et al composite ablation-transfer imaging medium, per se, comprises a support substrate (i), at least one intermediate "dynamic release layer"(ii) essentially coextensive therewith and an imaging radiation-ablative carrier topcoat (iii) also essentially coextensive therewith, said imaging radiation-ablative carrier topcoat (iii) including an imaging amount of a contrast imaging material contained therein, whether or not itself including a laser absorber/sensitizer, and said at least one dynamic release layer (ii) absorbing such imaging radiation, typically laser radiation, at a rate sufficient to effect the imagewise ablation mass transfer of at least said carrier topcoat (iii).

By "dynamic release layer" is intended an intermediate layer that must interact with the imaging radiation to effect imagewise ablative transfer of at least the carrier topcoat onto a receptor element at an energy/fluence less than would be required in the absence thereof. The dynamic release layer ("DRL") is believed to release the carrier topcoat by effectively eliminating the adhesive forces that bond or consolidate the carrier topcoat with the support substrate. Preferably, under the same conditions additional propulsion is simultaneously provided by the interaction of the imaging radiation therewith, e.g., by ablation of the dynamic release layer itself, thus further facilitating the imagewise ablative transfer of the entire carrier topcoat to a receptor element. Representative DRLs per Ellis et al include metal, metal alloy, metal oxide and metal sulfide thin films, etc., and the organics.

Thus, the LAT imaging films employed in, for example, the Foley et al and Ellis et al LATIS' described above have essentially been limited to those "permanent" films available from inventory, namely, pre-manufactured or pre-coated, and, hence, which inventory is typically inadequate to supply the complete spectrum of LAT imaging films that may be required for a particular application, e.g., not all colors, not all color densities, not all film thicknesses, etc., are usually available from inventory.

Consequently, unique means have now been developed, described in Ellis copending application Serial No. 07/978,482, filed Nov. 18, 1992, also assigned to the assignee hereof, for the on-demand or on-line production or generation, of LATIS imaging films that offers the end user a degree of flexibility and versatility hitherto alien to this art.

Such on-demand production/generation of LAT imaging films presents any one or more of an essentially infinite number of contrast imaging material options, as well any one or more of an essentially infinite number of thicknesses and CIM densities.

Too, such unique means for the on-demand production/generation of LATIS imaging films entails conventional toning techniques utilizing conventional liquid or dry toners, or liquid or dry toners especially modified or customized as to be tailored to a specific desire or LATIS application. Indeed, conventional or customized toners are employed that offer the option, whether from an economic and/or environmental standpoint, of recycling the unused toner from the non-imaged areas on imaged donor films.

The composite LAT imaging films described in the '482 Ellis application comprise a discontinuous or "toned" ablative topcoat and, hence, are improvedly laser radiation sensitive (by reason of the reduced adhesion of the discontinuous ablative topcoat to whatever substrate, whether or not including a DRL, in contradistinction to LAT imaging films which comprise a permanent, durably adhered continuous ablative topcoat).

In sum, the '482 Ellis application features the on-demand supply of appropriate substrate that will ultimately comprise the desired LAT film, and then on-site toning such substrate as to provide a unique composite film having a desired color or imaging functionality at a desired thickness or density, typically just prior to or immediately upstream of the actual imaging sequence.

To date, though, the state of the LATIS art has proven somewhat inflexible in that the known LAT techniques have essentially been limited to image transfer to one particular receptor element, itself strictly governing final image density, product morphology, amount of energy required for transfer, dimensionality of viewing of the final product, and the like.

SUMMARY OF THE INVENTION

Accordingly, a major object of the present invention is the provision of improved technique for laser ablation transfer imaging onto intermediate receptor elements presenting options of versatility and flexibility hitherto unknown to the LAT imaging art.

Briefly, the present invention features laser ablation transfer imaging onto special intermediate receptor elements which are useful for secondary, blanketwise lamination, notably via blanketwise thermal adhesion, of both the image and, desirably, a protective overcoating therefor, to a very wide variety of ultimate receptor substrates.

DETAILED DESCRIPTION OF PREFERRED EMBODIMENTS OF THE INVENTION

More particularly according to the present invention, provided are intermediate receptor elements useful for imaging laser ablation transfer films and the subsequent lamination, advantageously via thermal bonding, of the intermediate image to a very wide variety of support substrates therefor, while simultaneously, also advantageously, providing either a matte or glossy, abrasion-resistant overcoat to protect the image layer(s) on its/their final receptor substrate.

This invention also provides novel means for producing durable full color prints or proofs having a wide variety of surface characteristics.

Also provided are novel means for producing durable monochrome and multichrome transparencies, including photomasks and back-lit display and projection images.

In one preferred embodiment of LAT decalcomania according to the present invention, appropriate donor films, e.g., those described in the aforenoted Foley et al/Ellis et al '938 and '650 patents, or said Ellis copending application, Ser. No. 07/978,482, filed Nov. 18, 1992, are imaged under laser ablation transfer conditions, also described in said '938 and '650 patents, onto a characteristically heat-activated receptive layer of a special intermediate receptor element. The imaged intermediate receptor element is then heat-laminated to a final receptor substrate. In said preferred embodiment, peeling off a base substrate of the intermediate receptor exposes a polymer-protected mirror image on a final receptor substrate. Such final substrate may be reflective, translucent or transparent. The image's protective overcoat/overcoating is desirably matte or gloss, abrasion- and water-resistant.

Figure 1:
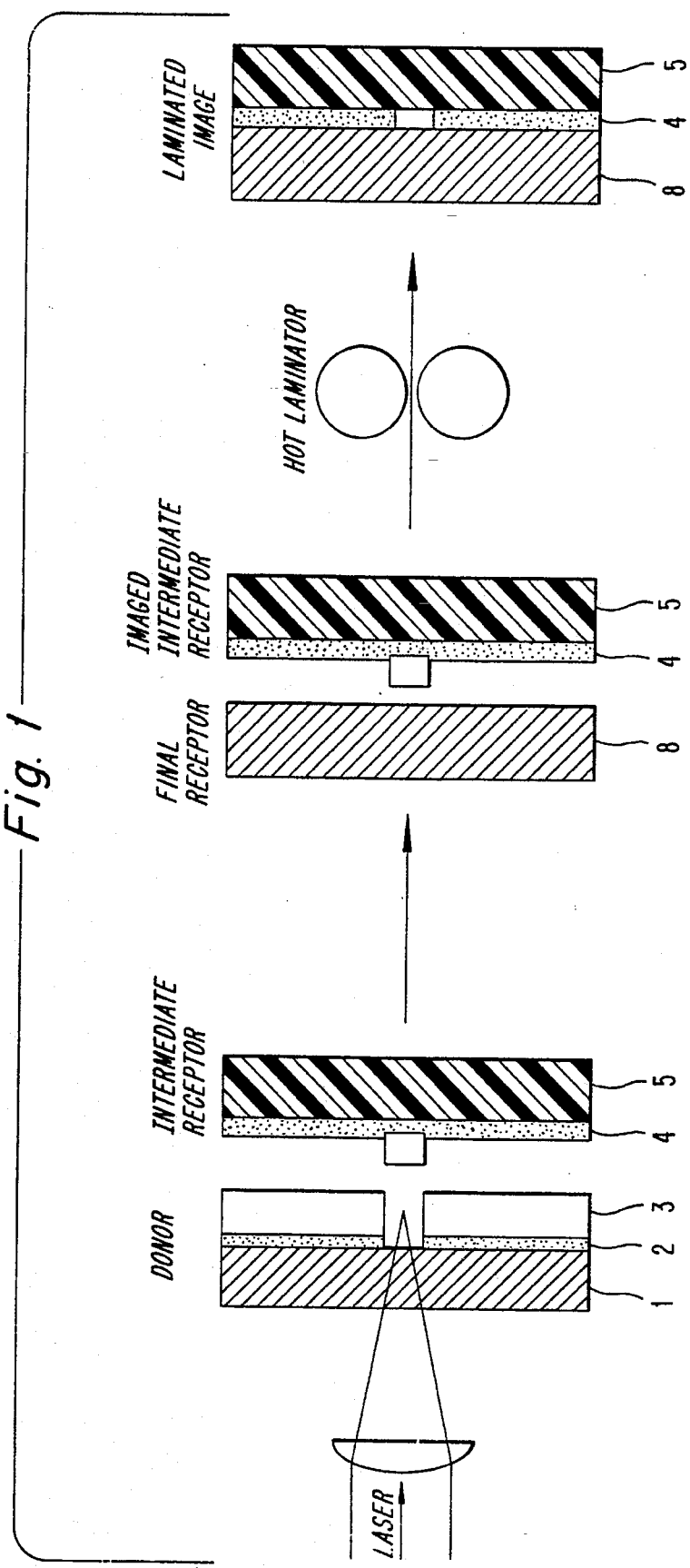
FIG. 1 is a block diagram/schematic of one embodiment of LAT imaging onto an intermediate receptor element and downstream lamination of the imaged substrate to a final receptor base, or "LAT decalcomania" according to the present invention, wherein the intermediate receptor remains intact, or integral, following lamination.

Referring specifically to the Figures of Drawing, in FIG. 1 an LAT ablation-transfer composite imaging medium, or donor, comprising a support substrate or base 1, at least one intermediate dynamic release layer 2 essentially coextensive therewith, and a laser radiation-ablative carrier topcoat 3 also essentially coextensive therewith (as described, for example, in the '650 Ellis et al patent), is imagewise laser-irradiated according to any particular pattern of intelligence with an intensity sufficient to effect the imagewise ablation mass transfer of the volume of the imagewise-exposed area of at least the laser radiation-ablative topcoat 3 of said imaging medium, securedly onto said intermediate receptor element and whereby said transferred contrast imaging material delineates said pattern of intelligence thereon.

In FIG. 1, the intermediate receptor element comprises a thermal adhesive 4 and a protective overcoat/base substrate 5 therefor.

After imaging, the imaged intermediate receptor element is then heat-laminated to a final receptor base 8, thus providing a protected image assembly. Suitable apparatus for such purpose includes the Model IT-6000 laminator available from Image Technologies Corp. and the Blazer DHC laminator available from Bryce Corp.

Figure 2:
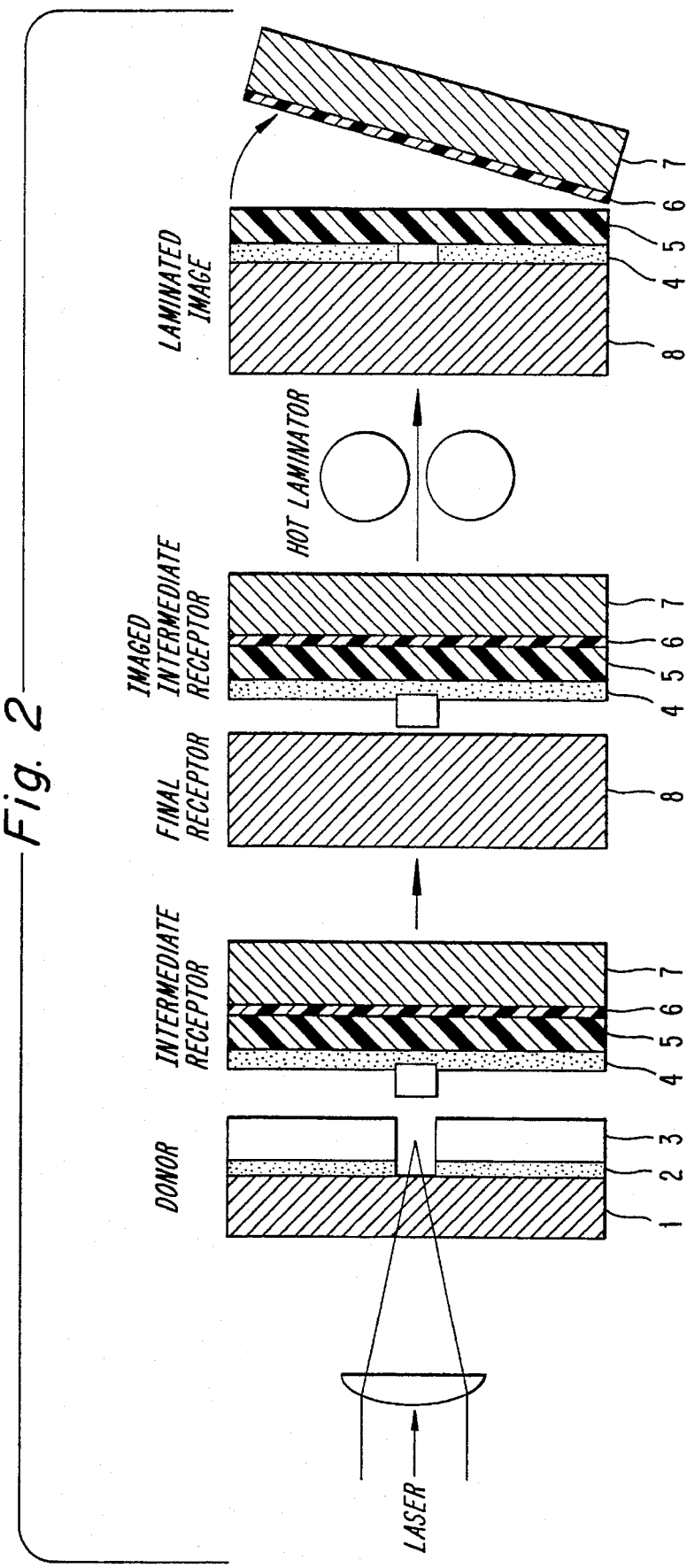
FIG. 2 is a block diagram/schematic of another embodiment of LAT imaging onto an intermediate composite receptor element and downstream lamination of the imaged substrate to a final receptor base according to this invention, but wherein at least one component or constituent layer of the composite intermediate receptor is stripped or peeled from the laminated image assembly.

In FIG. 2, a like LAT ablation-transfer composite imaging medium is also imagewise laser-irradiated according to any particular pattern of intelligence with an intensity sufficient to effect the imagewise ablation mass transfer of the volume of the imagewise-exposed area of at least the laser radiation-ablative topcoat 3 of said imaging medium, securedly onto said intermediate receptor element and whereby said transferred contrast imaging material again delineates said pattern of intelligence thereon.

However, in the preferred embodiment of FIG. 2, the intermediate receptor element comprises the thermal adhesive layer 4, a protective overcoat 5 intended to protect the final image, an optional release layer 6 and a base substrate 7.

After imaging, the imaged intermediate receptor element is then, as in FIG. 1, heat-laminated to a final receptor base 8.

Peeling off the base substrate 7 and the optional release layer 6 of the intermediate receptor provides a protected, typically a polymer-protected, mirror image of the "intermediate" image on the final receptor substrate or base 8.

As indicated above, the final substrate or base 8 may be reflective, translucent, transparent or opaque. The protective overcoating 5 therefor is advantageously matte or gloss, abrasion- and water-resistant.

Thus, it will be appreciated that LAT decalcomania per this invention presents the option of laser ablation transfer onto but a single material (intermediate receptor element), thereby permitting optimization of all LAT parameters to such single intermediate receptor (rather than having to adjust the LAT process parameters, depending upon each particular instance, to meet or fit a wide variety of substrates).

With particular regard to the intermediate receptor elements, per se, these can be many and varied. For example, the protective base substrate 5 in the embodiment of FIG. 1 and the corresponding protective overcoat 5 in the embodiment of FIG. 2 can be virtually any protective material, e.g., glass, polymer, etc., but is preferably durable, rub-, abrasion- and water-resistant.

The thermal adhesive layer 4 is advantageously of non-tacky (save, perhaps, during the LAT sequence), hot-melt type, and can even be statically charged. Too, pressure sensitive and photo-activated adhesives are also envisaged. Of course, the adhesive should not be so strong as to also remove non-imaged areas of the LAT imaging film.

Suitable materials for the optional release layer 6 include those well known to the art for such purpose, notably the typical silicone-based release agents, fluorocarbons, "slip" coatings, and the like. Of course, though, if the protective overcoat 5 and the base substrate 7 (embodiment shown in FIG. 2) are judiciously selected, separation, e.g., by peeling, can be carried out naturally and no release layer is required. Also in said FIG. 2 embodiment, the base substrate 7 can be virtually any material and is primarily intended only to lend structural integrity to the composite.

Particularly exemplary composites suitable as intermediate receptor elements per the embodiment of FIG. 2 according to the present invention are the transfer elements described in Himmelwright and Cahill copending application Ser. No. 08/094,989, filed Jul. 22, 1993, entitled "Transferable Protective Cover Layers," now U.S. Pat. No. 5,397,634 assigned to the assignee hereof and hereby expressly incorporated by reference and relied upon. These comprise (A) a temporary carrier layer, namely, a polymeric sheet material, e.g., PET or a polyolefin, a foraminous sheet material, or composite thereof, (B) a protective layer removably adhered to the temporary carrier layer and comprising a crosslinked cellulose ester, e.g., a cellulose acetate propionate and/or cellulose acetate butyrate, and (C) an adhesive layer permanently bonded to the protective layer, e.g., a visually transparent thermoplastic polyurethane, polycaprolactone, acrylic copolymer, or combination thereof.

Representative intermediate receptor elements according to the embodiment of FIG. 1 include a wide variety of commercially available mounting and laminating materials, for example the "Sallencap" and "Sallencap Flexigloss" gloss thermal laminating films and the pressure sensitive products marketed by Sallmetall, the "Sealeze" products marketed by Seal Products, Inc., and even "Scotch" tape for that matter.

It will also be appreciated that the final receptor can be essentially any base, whether paper, glass, metal, china, plastic, fabric, wood, board, film, etc. Moreover, it need not be flat and can be quite irregular or contoured. Accordingly, LAT imaging per this invention encompasses a true decal process, as the imaged intermediate receptor can even be "transferred" to automobiles, motorcycles, etc., i.e., virtually any substrate or preexisting article of manufacture, whether flat or irregular, unitary or composite. It is thus well suited, for example, for short run print applications, labels and bar codes, proofs, and the like.

Too, the thicknesses of the respective layers constituting the intermediate receptor element, whether as shown in FIG. 1 or in FIG. 2, are not at all critical. For example, the protective layer 5 is ideally as thin as possible, advantageously ranging from about 0.3 to 2 μm in thickness, while still serving to "protect" the image from the rigors of handling and use, exposure to environmental and other contaminants, and the like. The adhesive image-receiving layer may either be thick or thin, and, desirably, only enough adhesive if present as is required to laminate the imaged intermediate receptor to the final substrate.

It will thus be seen that LAT decalcomania according to this invention presents the option of fabricating an imaged final product, whereby the "transferred" image is viewed from the backside vis-a-vis viewing of the image provided on the intermediate receptor element. Advantages of viewing from the backside include assuring an optimized predetermined face surface—it is typically very flat and smooth (contrary to a paper face surface)—and, hence, the quality of the final image is enhanced in consequence of the improved covering power and density control thus provided. Also, when viewed from the backside, potential mottle is markedly limited versus the mottle visible on frontside viewing by reason of imaging of a diffracting adhesive surface.

It will also be seen that the usual additives and adjuvants can be incorporated into the composite articles of manufacture according to this invention, for example incorporating UV-protective agents or UV-stabilizers for the LAT image into either or both of the adhesive coatings and protective overcoats, etc.

In addition, as, for example, hot laminating of the imaged intermediate receptor to the final receptor base ofttimes physically compresses a fraction of the transferred image or pixel therein, characteristically without any lateral expansion thereof, as shown in FIGS. 1 and 2, the net effect thereof is a higher solid area density with better covering power from the same amount of material transferred. Also, as less material is required to be transferred to produce an image having a given density, less energy is needed for the LAT process.

Plus, as the image laminated to the final receptor base advantageously bears a protective coating, whether by hot laminating or even by overcoating the final image, a very smooth high solid density surface is thus provided, contributing to a mottle-free appearance.

Hence, the substance of the LAT decalcomania of the invention is the provision of options of versatility and flexibility, i.e., more variables such as degree of adhesion onto the intermediate receptor element, permitting better and more precise control over the total process, even when the same final receptor base is intended.

Exemplary final receptor/imaged intermediate receptor combinations are shown in FIG. 3. In FIG. 3(A), intended for backside viewing, the imaged intermediate receptor is transparent and the final base reflective. In such embodiment, the optical clarity of the final laminate interface is optimized by using an adhesive that is not light diffusing and does not impart any opacity to the final product. Suitable reflective layers include various papers, whether coated or uncoated, for example containing titanium dioxide or zinc oxide, and even metal layers, and the like.

Figure 3C:
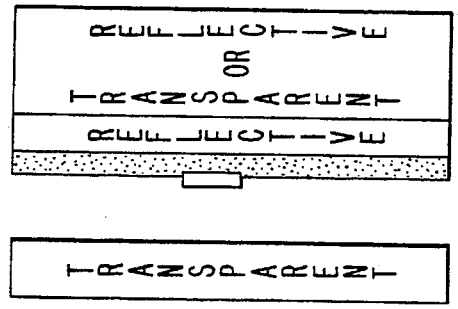
FIG. 3 is a series of final imaged intermediate receptor/ final receptor combinations according to the invention, wherein the ultimate laminated image is destined or intended for viewing either from the frontside, or from the backside, or both.
Figure 3F:
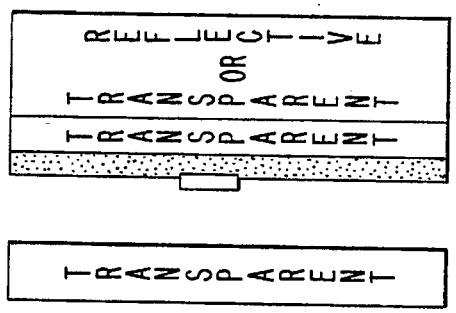
Figure 3B:
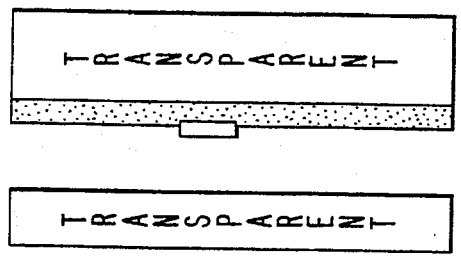

In FIG. 3(B), both the imaged intermediate receptor and the final base are visually transparent, permitting both frontside and backside viewing.

Figure 3E:
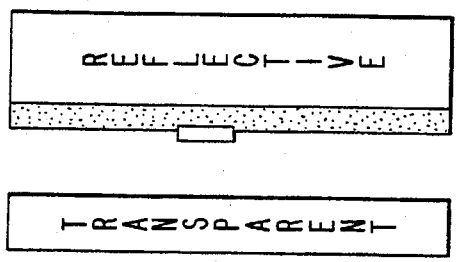
Figure 3A:
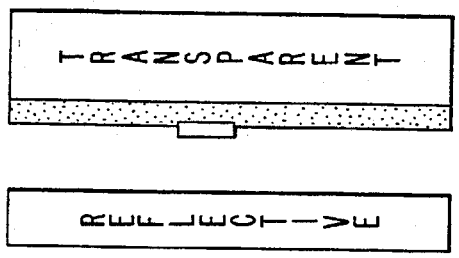

In FIG. 3(C), the reverse of the FIG. 3(A) construction, the imaged intermediate receptor is reflective and the final base transparent, intended for frontside viewing.

Figure 3D:
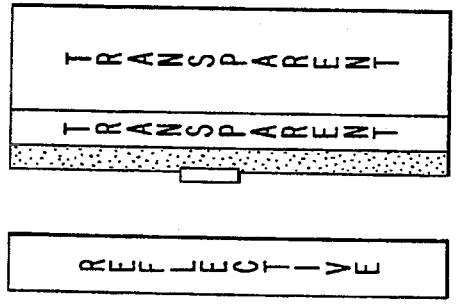

FIGS. 3(D) to 3(F) reflect variants of the embodiment of the invention illustrated in FIG. 2.

In FIG. 3(D), both the protective overcoat and the base substrate of the imaged intermediate receptor are transparent and the final base reflective, also intended for frontside viewing whether or not the base substrate is stripped therefrom.

FIG. 3(E) reflects a construction in which the final base is transparent, as is the protective overcoat, but the base substrate of the imaged intermediate receptor is either transparent or reflective. In the former instance, the ultimate laminate is suited for either frontside or backside viewing, whether or not the base substrate of the imaged intermediate receptor is stripped therefrom. In the latter, backside viewing is comprehended only after stripping the reflective base substrate therefrom.

And in FIG. 3(F), the final base is transparent, the protective overcoat reflective, and the base substrate of the imaged intermediate receptor is either transparent or reflective. In such instance, whether or not the base substrate of the imaged intermediate receptor is peeled therefrom, only frontside viewing is intended.

In order to further illustrate the present invention and the advantages thereof, the following specific examples are given, it being understood that same are intended only as illustrative and in nowise limitative.

EXAMPLE 1

(a) Manufacture of Intermediate Receptor Element:

A two-layer intermediate receptor element was constructed by Meyer rod coating a thin (0.3–3.0 μm) protective layer, essentially consisting of cellulose acetate propionate ("CAP"), onto a transparent 1 mil thick polyester base film. This construction was #10 Meyer rod overcoated, and thereafter air dried, on the CAP side, with a thin (0.3–2.0 μm) nontacky thermal or hot melt adhesive layer comprising a mixture of Elvax 40W (ethylene/vinyl acetate copolymer marketed by Du Pont), 1 gram, and a tackifier, Floral 105 (modified rosin ester marketed by Hercules), 1 gram, as well as a solvent blend (toluene/isopropanol, 90:10), 8 grams.

(b) Laser Ablation Transfer Imaging:

The intermediate receptor element produced in stage (a) was LAT imaged using a Crosfield Datrax 765 Facsimile System. The write engine of such system included a 16 watt Nd/YAG laser (emitting at 1064 nm) to provide the imaging radiation (ca. 6–8 watts at the film plane for a 25 micron diameter spot, scanned at 200 meters/second).

Donor sheets, described, for example in the aforesaid Ellis et al '650 patent, were sequentially placed, in face-to-face registered direct contact, coated side against the stage (a) intermediate receptor sheet mounted on the Datrax image transport truck. Laser writing was carried out at 8 watts (at film plane) and 1,200 lines per inch with the donor and the receptor sheets maintained together in a vacuum (ca. 26 in. Hg).

Color separated halftone films were read by the Crosfield Datrax reader to produce color separated digital image data files, which, when matched with the various color donors, were sequentially employed to modulate the laser writing to ultimately produce a full color image on the intermediate receptor sheet.

(c) Thermal Transfer/Lamination of a "Protected" Image:

The intermediate receptor imaged in stage (b) was imaged-side mated with a sheet of high quality uncoated office paper and passed through a heated (125° C.) roll laminator under pressure (500 lb/in$^2$). A protected glossy image on plain paper was obtained upon peeling off the intermediate receptor polyester backing.

The aforesaid process was repeated, with comparable results, using a coated paper ("Reflections" line of enamel paper marketed by Consolidated) final receptor.

This example corresponds to the embodiment shown in FIG. 2.

EXAMPLE 2

A monochrome transparent image was produced by repeating the procedure of Example 1, via the laser ablation transfer of a single black donor onto the intermediate receptor element, laminating it to a transparent 4 mil thick polyester film and peeling off the intermediate receptor polyester base.

EXAMPLE 3

The procedure of Example 2 is repeated using the same donor film and the same transparent polyester film final receptor, except that the intermediate receptor element is a commercially available heat laminating material marketed by Sallmetall as 5 mil thick Sallencap gloss thermal laminating film. In this example, corresponding to the embodiment shown in FIG. 1, no polyester base is peeled from the intermediate receptor element.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A composite article of manufacture comprising an adhesively coated LAT image protective overcoat, said protective overcoat comprising a reflective substrate and bearing a contrasting LAT image pattern of intelligence on the adhesive face surface thereof and having a base substrate superposed on the other face surface thereof, and said adhesive face surface being laminated to a final base element.

2. The composite article as defined by claim 1, said final base element having an irregular or contoured face surface.

3. A full-color print or proof, photomask, monochrome or multichrome transparency, label or bar code comprising the composite article of manufacture as defined by claim 1.

4. The composite article as defined by claim 1, comprising a release layer between said protective overcoat and said base substrate.

5. The composite article as defined by claim 1, said adhesive coating comprising a visually transparent adhesive.

6. The composite article as defined by claim 5, said adhesive coating comprising a thermally activated adhesive.

7. The composite article as defined by claim 5, said adhesive coating comprising a pressure sensitive adhesive.

8. The composite article as defined by claim 1, said final receptor base element comprising a plastic sheet.

9. The composite article as defined by claim 1, said final receptor base element comprising a paper, glass or metal substrate.

10. The composite article as defined by claim 1, said base substrate comprising a polymeric and/or foraminous sheet material.

* * * * *